(12) United States Patent
Compeau

(10) Patent No.: US 10,193,050 B2
(45) Date of Patent: Jan. 29, 2019

(54) HANDLE FOR A COOKING VESSEL, COMPRISING A LATENT HEAT SINK

(71) Applicant: SEB S.A., Ecully (FR)

(72) Inventor: Jean-Louis Compeau, Saint Quentin Fallavier (FR)

(73) Assignee: SEB S.A., Ecully (FR)

( * ) Notice: Subject to any disclaimer, the term of this patent is extended or adjusted under 35 U.S.C. 154(b) by 0 days.

(21) Appl. No.: 15/515,351

(22) PCT Filed: Sep. 28, 2015

(86) PCT No.: PCT/FR2015/052577
§ 371 (c)(1),
(2) Date: Mar. 29, 2017

(87) PCT Pub. No.: WO2016/051058
PCT Pub. Date: Apr. 7, 2016

(65) Prior Publication Data
US 2017/0244020 A1    Aug. 24, 2017

(30) Foreign Application Priority Data

Sep. 30, 2014   (FR) ...................................... 14 59230

(51) Int. Cl.
*H01L 35/32* (2006.01)
*A47J 36/06* (2006.01)
*A47J 37/10* (2006.01)
*A47J 45/06* (2006.01)
*H01L 35/10* (2006.01)
*H01L 35/14* (2006.01)

(52) U.S. Cl.
CPC .............. *H01L 35/32* (2013.01); *A47J 36/06* (2013.01); *A47J 37/101* (2013.01); *A47J 45/06* (2013.01); *A47J 45/063* (2013.01); *A47J 45/068* (2013.01); *H01L 35/10* (2013.01); *H01L 35/14* (2013.01); *A47J 45/061* (2013.01)

(58) Field of Classification Search
CPC .................... H01L 27/16; H01L 35/00–35/34
USPC ................................... 136/200–242
See application file for complete search history.

(56) References Cited

U.S. PATENT DOCUMENTS

| 6,279,568 | B1 | 8/2001 | Anthony | |
| 6,570,362 | B1* | 5/2003 | Estes | H01L 23/38 136/205 |
| 2002/0040711 | A1 | 4/2002 | Anthony | |
| 2008/0008858 | A1* | 1/2008 | Hong | E04D 5/12 428/143 |
| 2008/0290104 | A1 | 11/2008 | Ng et al. | |
| 2011/0268153 | A1* | 11/2011 | He | A47J 37/108 374/179 |

(Continued)

FOREIGN PATENT DOCUMENTS

| CN | 201015533 Y | 2/2008 |
| DE | 102012202196 A1 | 8/2013 |
| EP | 2361538 A1 | 8/2011 |

*Primary Examiner* — Bach T Dinh
(74) *Attorney, Agent, or Firm* — The Webb Law Firm

(57) ABSTRACT

The invention relates to a handle for a cooking vessel that includes at least one thermoelectric generator. The thermoelectric generator includes at least a first contact surface thermally connected to a heat sink and the heat sink is formed from a material that undergoes a phase transition when heated to temperatures varying between 50° C. and 70° C.

7 Claims, 2 Drawing Sheets

(56) References Cited

U.S. PATENT DOCUMENTS

2013/0098417 A1* 4/2013 Gavillet ............. H01L 23/4275
                                                                             136/200

* cited by examiner

HANDLE FOR A COOKING VESSEL, COMPRISING A LATENT HEAT SINK

CROSS-REFERENCE TO RELATED APPLICATIONS

This application is the United States national phase of International Application No. PCT/FR2015/052577 filed Sep. 28, 2015, and claims priority to French Patent Application No. 1459230 filed Sep. 30, 2014, the disclosures of which are hereby incorporated in their entirety by reference.

BACKGROUND OF THE INVENTION

Field of the Invention

The invention pertains to the field of handles for cooking vessels (also referred to as vessels) or for lids of cooking vessels, referred to simply as lids. The invention pertains more specifically to handles with built-in power supply devices for the purpose of powering electronic functions that operate on the principle of thermoelectric conversion.

Description of Related Art

There already exist cooking vessels, such as frying pans, that use a power supply device, such as a thermoelectric generator, to power an electronic temperature indication system situated in the handle. When the frying pans are heated, a heat flow is created. The thermoelectric generator uses this heat flow to produce the electricity necessary for the electronic indication system to operate.

Patent document CN201015533 describes a frying pan that comprises a pan body, as well as a handle that is screwed onto said frying pan. The frying pan also comprises a temperature sensor, and this temperature can be shown on a display built into the handle. To power this sensor and display, the frying pan comprises a thermoelectric generator, which generates the electricity for the sensor and display to operate. To produce electricity, this thermoelectric generator comprises two surfaces, the first of which is positioned against the pan body. This positioning makes it possible to establish a heat exchange between the thermoelectric generator and the body of the pan. This document also describes a heat sink connected to the second surface of the thermoelectric generator. The heat sink is designed to promote the cooling of the thermoelectric generator, and takes the form of a metal radiator comprising fins that stand vertically and parallel to one another, in order to create a current of air for convection cooling and a sufficient exchange of air with the surrounding air.

However, in order for such a radiator to be effective, the dimensions of the fins must be such that they occupy a significant space inside the handle. It is therefore difficult to imagine being able to place other devices inside this handle, such as an electronic system. Another disadvantage encountered is that the operation of this radiator may be disrupted, or even prevented, depending on how the appliance is used, due to the circulation of the surrounding air in proximity to this radiator.

SUMMARY OF THE INVENTION

One solution proposed by this invention is to provide a heat sink for a handle of a cooking vessel or lid, which does not rely on convection cooling, in order to make this heat sink more effective and take up less space inside the handle.

This objective is attained with a handle for a cooking vessel or lid that comprises at least one thermoelectric generator, and the thermoelectric generator comprises at least one first contact surface connected thermally to a heat sink, and according to one characteristic of the invention, the heat sink is comprised of a material that undergoes a phase transition when the material is heated to a certain temperature.

According to one characteristic of the invention, the heat sink is comprised of a solid material, which melts between 50° C. and 70° C.

According to one characteristic of the invention, this solid material is a solid paraffin-based mixture.

According to one characteristic of the invention, the handle comprises a heat diffuser.

According to one characteristic of the invention, the heat diffuser comprises one or more metal rods.

According to one characteristic of the invention, the handle comprises a connection part positioned between the thermoelectric generator and the heat diffuser.

According to one characteristic of the invention, the heat diffuser is attached to the connection part.

According to one characteristic of the invention, the handle comprises an electronic device connected to the thermoelectric generator.

According to one characteristic of the invention, the electronic device may be an electronic display or an electronic sensor.

BRIEF DESCRIPTION OF THE DRAWINGS

The objectives, aspects and advantages of this invention will be better understood through the description provided below of one particular embodiment of the invention, which is presented as a non-limiting example, in reference to the attached drawings, in which.

DESCRIPTION OF THE INVENTION

Figure 1:
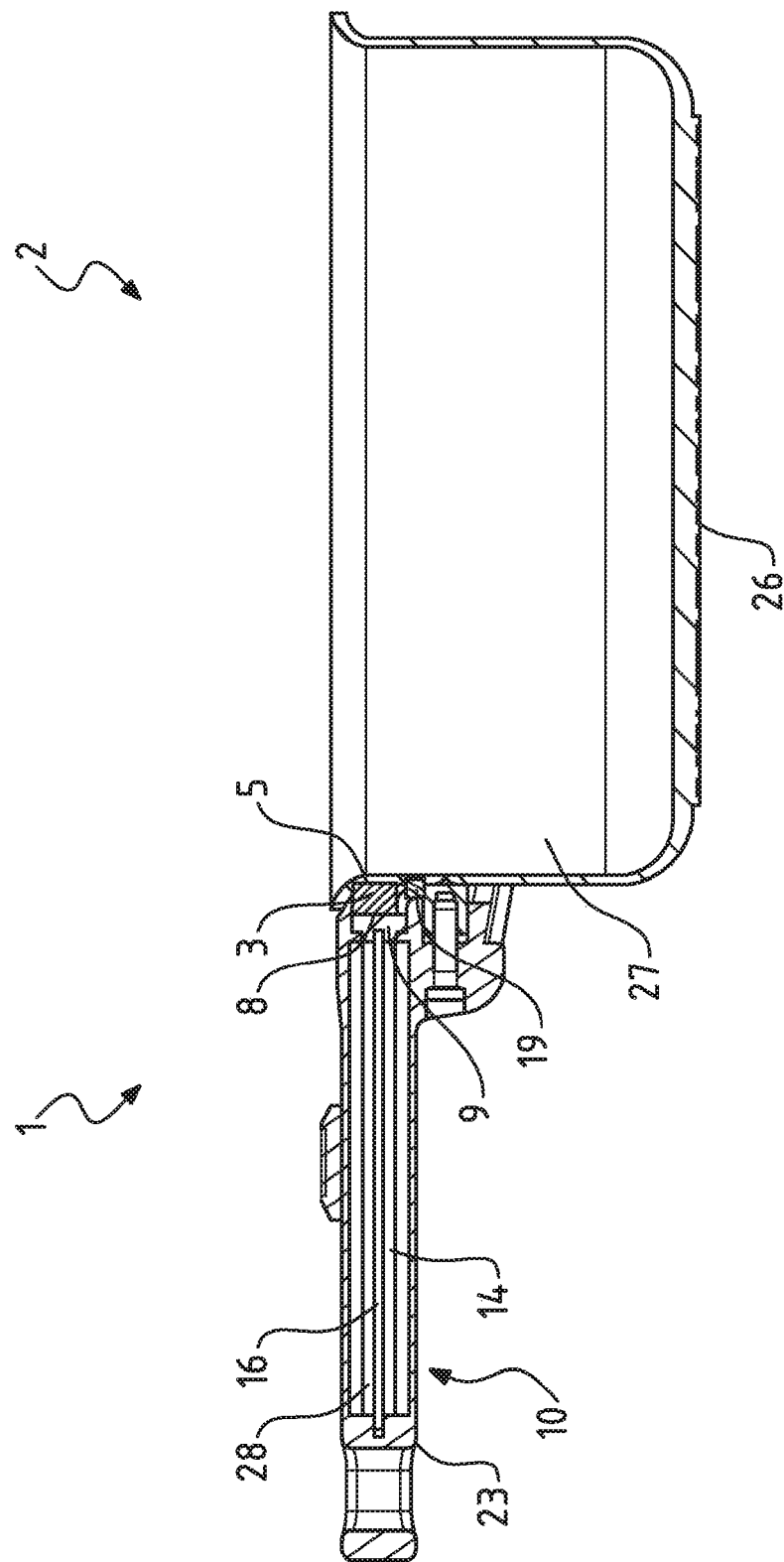
FIG. 1 is a cross-section view of a cooking vessel comprising a handle as described in the invention.

The handle (1) for a cooking vessel (2) or lid, as depicted in FIG. 1, is positioned in a fixed manner on a cooking vessel (2), hereinafter referred to simply as a vessel (2).

The handle (1) is attached to the vessel (2) or the lid in a traditional manner, either by a mechanical screw-nut system, or by a rivet system.

As for the vessel (2), it comprises a bottom (26), a wall (27) that surrounds the bottom (26) and a handle (1). This vessel (2) may be, for example, a frying pan, but can also be a saucepan, stockpot or any other metal container designed to be heated thermally from the bottom (26). The vessel (2) may be made of aluminum or any other heat-conductive material.

The handle (1) comprises a main body (23). In a non-limiting manner, said main body is made of a heat-stable material. This body (23) may be made of any material that does not conduct heat.

The main body (23) is hollow in the center and along the length of the handle (1) in order to obtain a cavity (28).

The handle (1) comprises a thermoelectric generator (3). The latter is comprised of at least one thermoelectric module, which may be a Peltier module. In this case, it has two contact surfaces (5, 8). A first (5) "hot" contact surface is placed in contact with a heat source, while the second (8) "cold" contact surface is placed in contact with a cold source.

When the handle is attached to the vessel (2), the first (5) contact surface of the thermoelectric generator (3) comes into contact with the wall (27) of the vessel (2).

Still in reference to FIG. 1, the handle (1) also comprises a connection part (9). The second (8) contact surface of the thermoelectric generator (3) is connected thermally to this connection part (9).

The handle (1) also comprises a heat sink (10). This heat sink (10) is contained inside the cavity (28) of the handle (1).

According to two variations, this heat sink (10) may be either connected to the connection part (9), or connected directly to the second (8) contact surface of the thermoelectric generator (3). In both cases, the contact has minimal thermal resistance.

In the second case, this means that the connection part (9) has been removed.

This heat sink (10) is comprised of a material that undergoes a phase transition when the material is heated to temperatures ranging from 50° C. to 70° C.

In the embodiment of the heat sink (10) as described in the invention, shown in FIG. 1, said heat sink is comprised of a solid material (14) that melts between 50° C. and 70° C.

In one particular embodiment of the solid material (14), it is a solid paraffin-based mixture.

The handle (1) may also comprise a heat diffuser (16). The heat diffuser (16) extends longitudinally inside the handle (1) and more specifically inside the heat sink (10).

According to one characteristic of the invention, the heat diffuser (16) comprises one or more metal rods that are either connected to the connection part (9), or connected directly to the second (8) contact surface of the thermoelectric generator (3). In both cases, the contact has minimal thermal resistance.

Figure 2:
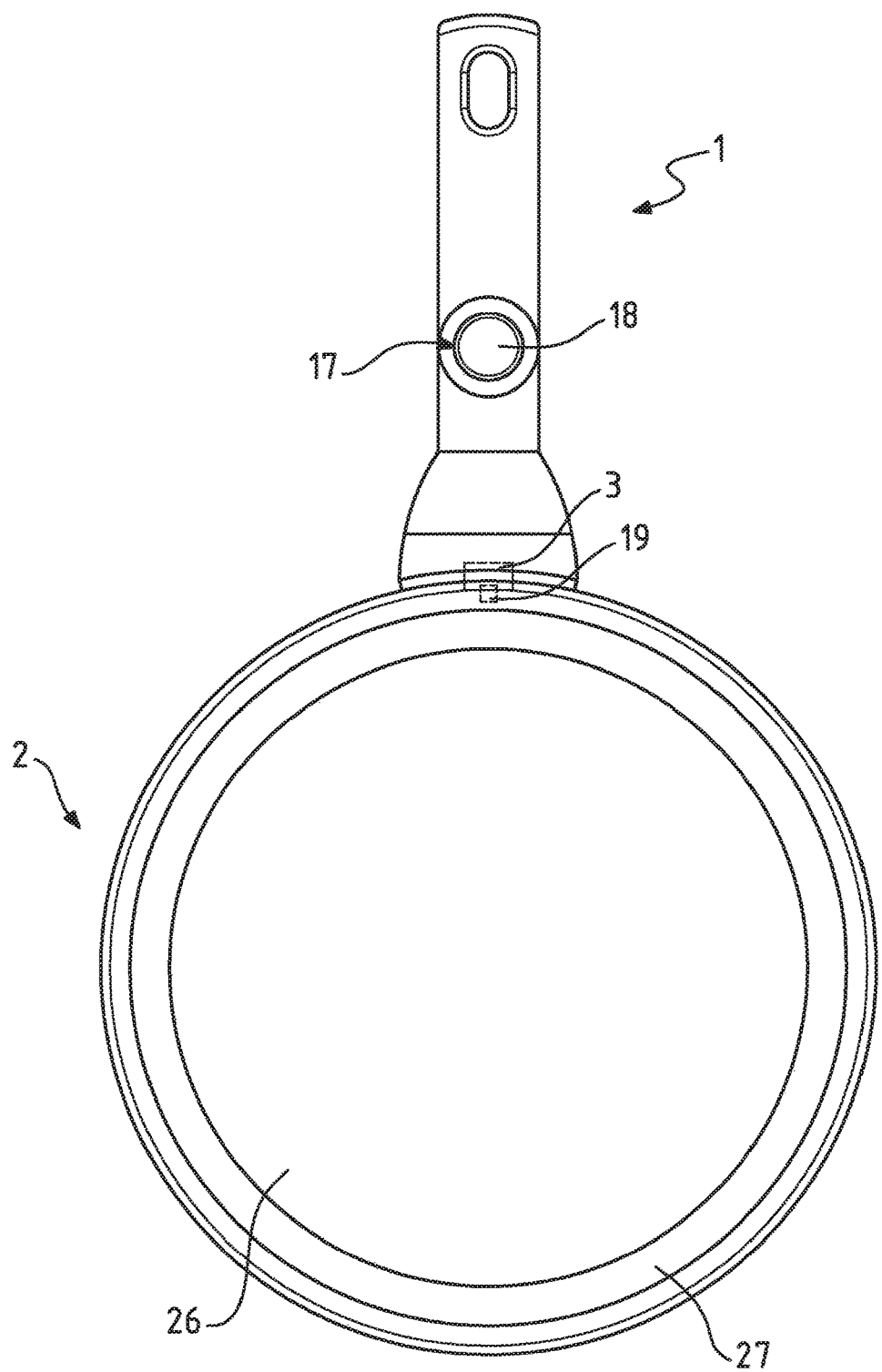
FIG. 2 is a view from above of a cooking vessel comprising a handle as described in the invention.

The handle (1) may also comprise an electronic device (17), as shown in FIG. 2, connected to the thermoelectric generator (3). This electronic device (17) may be an electronic display (18) or an electronic sensor (19).

This electronic sensor (19) may be, for one non-limiting example, a temperature sensor.

For a lid of a vessel, the construction is the same as with the utensil (2).

When the vessel (2) is heated, it will gradually warm up. The wall (27) against which the first (5) surface contact of the thermoelectric generator (3) is placed, also rises in temperature.

This wall will be the heat source for the thermoelectric generator (3).

When the heat sink (10) is comprised of a solid material, the melting point of which is between 50° C. and 70° C., it is this solid material (14) that is used as a cold source for the thermoelectric generator (3), and more specifically the latent phase change energy of this solid material (14), which is stored in the cavity (28) in proximity to the thermoelectric generator (3). This solid material (14), of the solid paraffin type, should, in turn, transfer this latent energy to the environment while the product is not in use, which should not pose a problem, given the usage cycles of household products.

When the vessel (2) is heated, a flow is established through the thermoelectric generator (3), going from the heat source (the wall (27) of the vessel (2)) to the cold source consisting of the solid material (14) and potentially the heat diffuser (16). At first, the temperature of the solid material (14) will gradually rise from room temperature to its melting temperature (approximately 50° C.). Next, the solid material (14) will gradually melt, remaining at a temperature of about 50° C., thereby enabling the heat flow through the thermoelectric generator (3) to remain constant, and the same is true for the electricity production. During this time, the temperature of the handle (1) remains relatively cool as compared to a traditional handle. After a certain amount of time, which depends on the amount of solid material (14) and the power of the heat source, the solid material (14) will be completely melted, and the temperature of the handle (1) will begin to rise again until it reaches a thermal equilibrium with the ambient temperature.

In this case, the purpose of the heat diffusers (16) is to facilitate the thermal transfer from the heat source to the cold source, as well as to optimally diffuse the heat in the entirely of the solid material (14).

It is also possible to have such a construction without heat diffusers (16).

In a standard case in which the vessel (2) is placed on a cooktop emitting 300 W, a handle (1) containing 40 cm$^3$ of solid paraffin-type material (14) enables the thermoelectric generator (3) to operate stably for 85 minutes, the maximum usable power being 20 mW at 2.5 V, while the exterior temperature near the handle (1) remains at 66° C.

It is understood that various modifications and/or improvements that are obvious to a person of ordinary skill in the art, may be made to the embodiment of the invention described in this description, while still remaining within the scope of the invention defined by the attached claims.

The invention claimed is:

1. A handle for a cooking vessel or lid that comprises at least one thermoelectric generator, wherein the thermoelectric generator comprises at least one first contact surface connected thermally to a heat sink, and the heat sink is comprised of a material that undergoes a phase transition when the material is heated to temperatures of 50° C. to 70° C.,
   wherein the heat sink fills a cavity of the handle with a heat diffuser comprising one or more rods that extend through the heat sink.

2. The handle for a cooking vessel or lid according to claim 1, wherein the material of which the heat sink is comprised is a solid material that melts between 50° C. and 70° C.

3. The handle for a cooking vessel or lid according to claim 2, wherein the solid material is a solid paraffin-based mixture.

4. The handle for a cooking vessel or lid according to claim 1, wherein the handle comprises a connection part positioned between the thermoelectric generator and the heat diffuser.

5. The handle for a cooking vessel or lid according to claim 4, wherein the heat diffuser is attached to the connection part.

6. The handle for a cooking vessel or lid according to claim 1, wherein the handle comprises an electronic device connected to the thermoelectric generator.

7. The handle for a cooking vessel or lid according to claim 6, wherein the electronic device may be an electronic display or an electronic sensor.

* * * * *